United States Patent [19]
Miller

[11] Patent Number: 5,130,894
[45] Date of Patent: Jul. 14, 1992

[54] THREE-DIMENSIONAL CIRCUIT MODULES

[75] Inventor: Wayne H. Miller, Atlantic Highlands, N.J.

[73] Assignee: AT&T Bell Laboratories, Murray Hill, N.J.

[21] Appl. No.: 617,704

[22] Filed: Nov. 26, 1990

[51] Int. Cl.$^5$ .............................................. H05K 7/00
[52] U.S. Cl. ..................................... 361/393; 361/400; 361/409; 361/412; 361/414; 439/65; 439/591
[58] Field of Search ............... 361/393, 396, 400, 409, 361/403, 410, 412, 414, 416; 439/66, 65, 44, 86, 91, 591

[56] References Cited

U.S. PATENT DOCUMENTS 5,019,946 5/1991 Eichelberger et al. ............. 361/414

OTHER PUBLICATIONS

"A 3-D System for Interconnection Meets the Challenge of High Density Packaging", M. Ansley, I.C.D.C., Ltd. Workingham, Berkshire, England, Electronic Packaging & Production, Apr. 1985.
"3-D Packaging Spawns Smaller, Faster Systems", Walter Shroen and Satwinder Malhi, Texas Instruments Inc. Dallas, TX, Surface Mount Technology, Aug. 1989.
"Three-Dimensional Multilayer Ceramic Wiring Structure for Semiconductor Devices", M. E. Ecker, IBM Technical Disclosure Bulletin, vol. 27, No. 5, Oct. 1984.
"Orthogonal Chip Mount—A 3D Hybrid Wafer Scale Integration Technology", by S. D. S. Malhi, H. E. Davis, R. J. Stierman, K. E. Bean, C. C. Driscol, P. K. Chatterjee, Semiconductor Process and Design Center, Texas Instrument Inc., Dallas, TX IEEE 1987.

Primary Examiner—Leo Picard
Assistant Examiner—Young S. Whang
Attorney, Agent, or Firm—Geoffrey D. Green

[57] ABSTRACT

Disclosed is a three-dimensional circuit structure particularly useful in semiconductor memories. The circuit structure consists of a stack of modules mounted on a mother board with connectors between adjacent modules in the stack. The connectors mate with staggered and through terminals on the modules; the staggered terminals being used for circuits routed to destinations on specific modules and the through terminals for circuits routed to destinations on more than one module.

9 Claims, 3 Drawing Sheets

THREE-DIMENSIONAL CIRCUIT MODULES

FIELD OF THE INVENTION

This invention relates to electronic-circuit assemblies and more particularly to electronic-circuit modules that can be assembled in three-dimensional configurations.

BACKGROUND OF THE INVENTION

Printed circuit boards are widely used for mounting and interconnecting components in circuit assemblies. Such circuit boards are fabricated in many varieties, including single-sided boards, double-sided boards and multi-layer boards, and with conductors and connecting arrangements compatible with the number and spacing of terminals on the most complex electronic devices, such as integrated circuits embodying microprocessors, memory, digital controllers and the like.

To conserve space, it is often desirable to arrange printed circuit boards in a three-dimensional structure. This can be accomplished by plugging circuit boards into connectors mounted in a backplane, mounting circuit boards perpendicular or parallel to other boards and various other arrangements.

Mounting circuit boards parallel to each other can be a particularly effective way of achieving a three-dimensional structure, provided that the necessary connections can be made between adjacent boards. Various means are available for making such connections, for example, the interconnecting spacers described in the article entitled "A 3-D System for Interconnection Meets the Challenge of High Density Packaging" beginning on page 84 of the Apr., 1985 issue of Electronic Packaging and Production, stacking connectors made by suppliers such as Teledyne Kinetics, Solana Beach, Calif. and Cinch, Chicago, Ill. and elastomeric connectors made by suppliers such as PCK Elastomerics, Inc., Hatboro, Pa. and AT&T, Richmond, Va. Both the stacking connectors and the elastomeric connectors have the advantage that they can be positioned to connect areas anywhere on the circuit boards being connected and do not have to be located at the edges of the boards.

Once a decision has been made to use parallel circuit boards with interconnecting means between the boards, the connections on the boards must be configured so that the necessary circuits can be routed from the connecting areas to the proper destinations on the various boards. It is sometimes the case that some circuits can be "bussed" (connected in multiple) to adjacent boards, while others must be routed individually to specific boards. For example, in a semiconductor memory having individual memory chips arranged on parallel circuit boards, address, data and power circuits can be bussed to all the boards, but read and write circuits must be routed separately to each board. The kinds of connectors described above are all suitable for bussed connections as well as individually routed circuits, for example, as described in the final paragraph of the article referred to above.

It is desirable to minimize the number of different circuit board designs necessary when configuring a system using circuit boards stacked parallel to each other and even more desirable to be able to use the same design for each board in a stack. However, if it is necessary to route individual circuits to specific boards, as in the semiconductor memory described above, some arrangement must be devised by which such circuits can be routed from a source to a destination using identical boards. The invention to be described provides a solution to this problem.

SUMMARY OF THE INVENTION

This invention provides an arrangement by which individual circuits can be routed to destinations in a parallel stack of identical circuit modules or boards. This is accomplished by providing staggered terminals on the circuit boards whereby an individual circuit connected to such a terminal on one side of the board is shifted to a different position on the other side of the board. The invention further provides arrangements whereby such circuit modules or boards can be stacked on one or both sides of a "mother" board to which such individual circuits are all routed. These and other aspects of the invention will become apparent from consideration of the drawings and the following description.

For illustrative purposes, the invention will be described in terms of a series of circuit modules for a simple semiconductor memory, for which the invention is particularly useful. However, as will become apparent, the invention is not limited to such an application and can be used in modular design of any type of circuit requiring individual circuits to be routed to identical modules.

Figure 1:
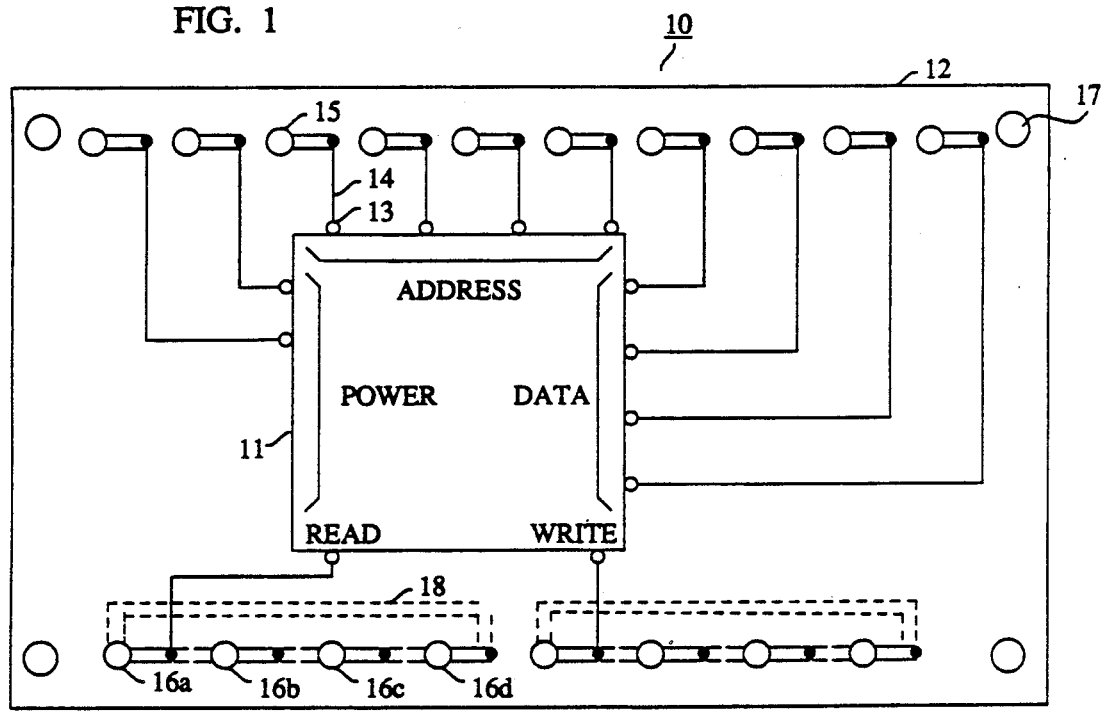
FIG. 1 is a diagrammatic representation of an exemplary circuit module having circuit connections configured in accordance with the invention.

FIG. 1 shows a semiconductor memory module 10 configured in accordance with the invention. Memory chip 11 is mounted on circuit board 12 with terminals on chip 11, such as terminal 13, connected to conductors, such as conductor 14, on board 12 in the conventional manner. For clarity, a much simplified module is shown with a single memory chip having only four address leads, four data leads, two power leads, a read lead and a write lead. Such simplified module is adequate to describe the invention. However, it will become clear that the invention can be used advantageously with modules having many more connections, with more than one chip per module, chips on both sides of the module and many other module configurations.

Figure 3:
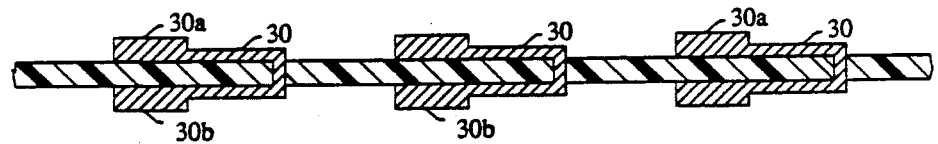
FIGS. 3 and 4 are partial sections of through and staggered terminals used in the module of FIG. 1 and the mother board of FIG. 2.

Leads that are to be connected in a bus configuration to corresponding leads in other modules, such as the address, data and power leads from chip 11, are connected to terminals such as 15 on board 12 that provide connecting areas at the same location on opposite sides of the board. Such terminals are referred to herein as through terminals. FIG. 3 is a sectional view showing through terminals 15 in more detail.

Figure 4:
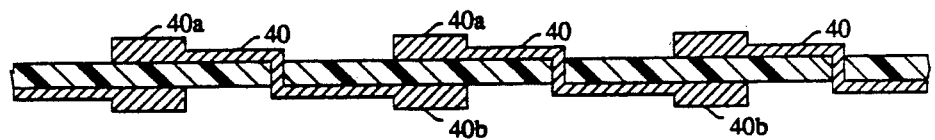

Leads that are to be connected independently, such as the read and write leads from chip 12, are connected to terminals such as 16 on board 12 that provide connecting areas at different locations on opposite sides of the board. Such terminals are referred to herein as staggered terminals. FIG. 4 is a sectional view showing staggered terminals 16, and a typical arrangement of such terminals.

Figure 2:
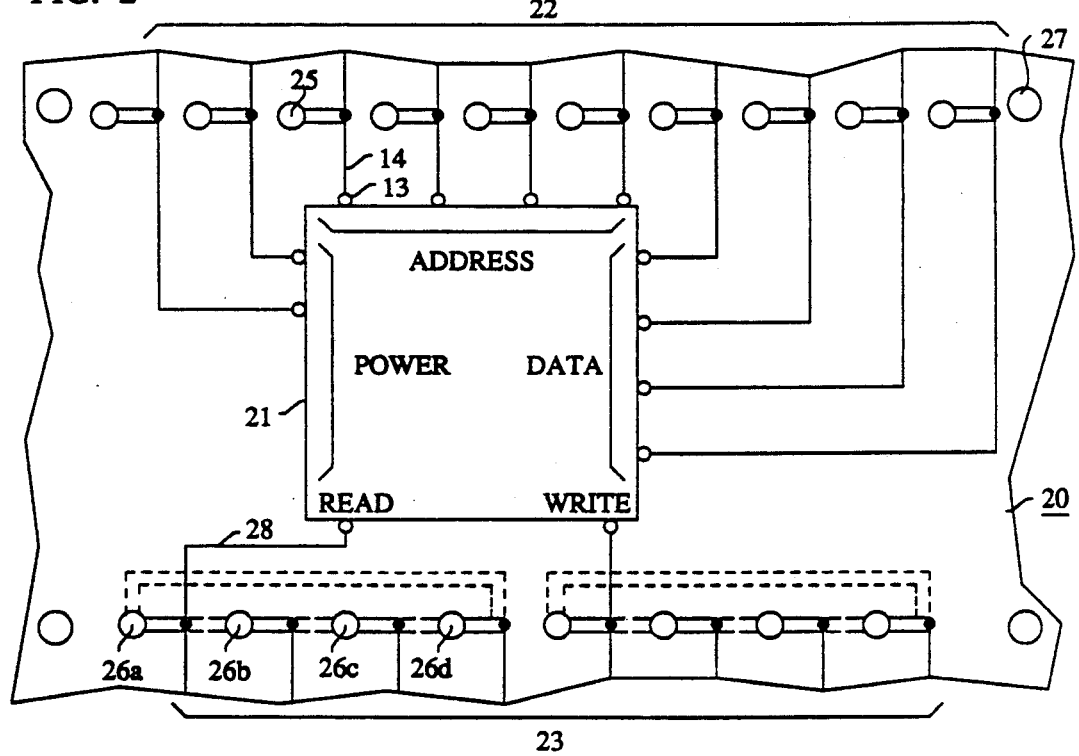
FIG. 2 is a diagrammatic representation of a mother board configured in accordance with the invention on which the modules shown in FIG. 1 can be mounted.

FIG. 2 shows a mother board 20 on which modules of the type shown in FIG. 1 can be mounted. A memory chip 21 can also be mounted on mother board 20, and the various leads from chip 21 are connected to through terminals such as 25 and staggered terminals such as 26 in exact correspondence to the equivalent connections on module 10 shown in FIG. 1. However, mother board 20 has additional conductors 22, which connect the bussed address, data and power leads to appropriate circuitry and power sources (not shown), and additional leads 23, which connect the individual read and write leads for memory chip 21 mounted on the mother board and, as will be seen, for memory chips 11 mounted on modules 12, to appropriate circuitry (not shown).

Mounting holes such as 17 on module 10 and 27 on mother board 20 are used for mounting modules 10 in a stack on mother board 20.

A typical memory arrangement might call for the various selection, driving and register circuits for the memory to also be located on mother board 20. Alternatively, such circuits could be placed elsewhere and connected to leads 22 and 23 on mother board 20 through additional connectors. Such arrangements are familiar to those skilled in the art.

As can be seen from FIG. 3, through terminals 30 (15 in FIG. 1 and 25 in FIG. 2) have connecting areas 30a and 30b at the same location on opposite sides of circuit board 31. However, as shown in FIG. 4, staggered terminals 16 have connecting areas 16a and 16b at different locations on opposite sides of circuit board 31. In FIG. 4, staggered terminals 40 (16 in FIG. 1 and 26 in FIG. 2) are arranged so that the connecting area 40a of one terminal is opposite the connecting area 40b of an adjacent terminal. As will be seen, when modules having such staggered terminals are stacked, circuits routed through such terminals are shifted one position at each layer in the stack. However, other arrangements for interconnecting the opposing connecting surfaces are useful, as will also be seen.

Figure 5:
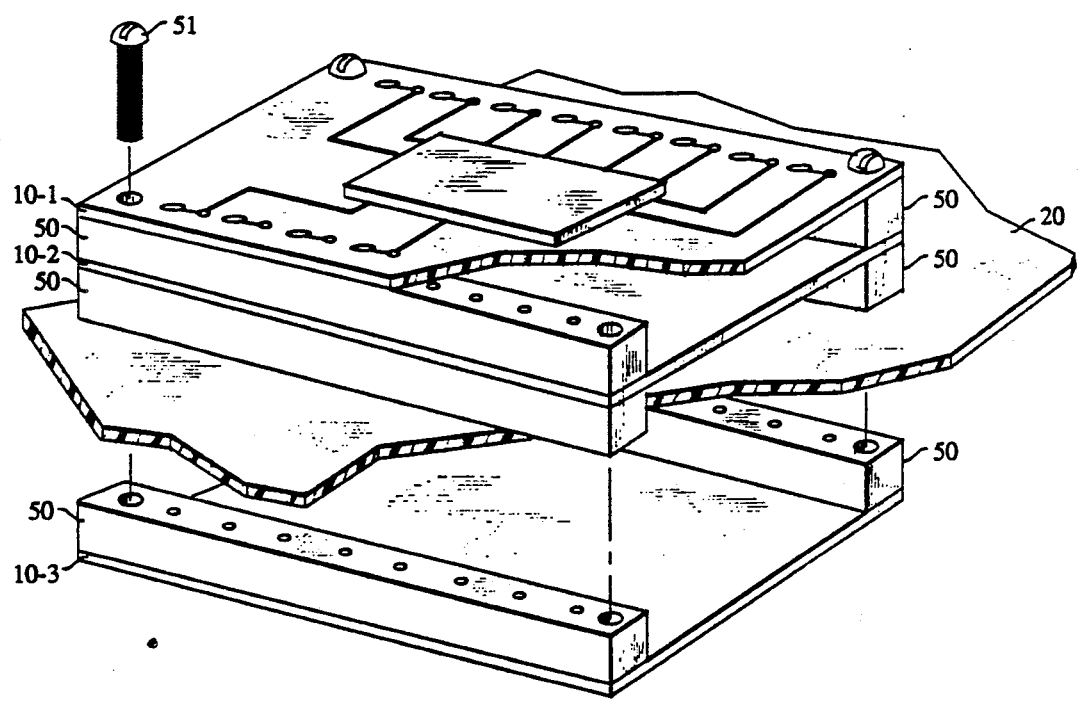
FIG. 5 is a perspective view of the modules of FIG. 1 stacked on both sides of the mother board of FIG. 2.

FIG. 5 is a perspective view of a stack comprising identical modules 10-1, 10-2, and 10-3 mounted on mother board 20, with connectors 50 serving both as spacers and as means for interconnecting opposing connecting areas on the modules and mother board. Such connectors can be the stacking connectors or elastomeric connectors described above, or other suitable connectors. Note that modules 10-1 and 10-2 are mounted on one side of mother board 20 and module 10-3 is mounted on the other. As will become apparent, the modules can be mounted on whichever side of the mother board is most convenient; all can be on one side or all on the other if desired. Bolts such as 51 hold the stack together. Bolts 51 can also serve to feed power from mother board 20 to modules 10, as an alternative to terminals such as 15, and as heat sinks to aid in dissipating heat generated by modules 10 and mother board 20. For these purposes, holes 17 and 27 would be fabricated as plate-through holes with appropriate electrical connection to the circuitry on modules 10 and mother board 20, respectively, and such holes would be sized for proper electrical and thermal connection to bolts 51.

It will now be useful to describe the staggered terminals and their interconnections on modules 10 and mother board 20 in more detail. Referring back to FIG. 1, staggered terminal 16a is connected to the "read" terminal of chip 11 and has a back connecting area lined up with the front connecting area of staggered terminal 16b. Correspondingly, the back connecting area of staggered terminal 16b lines up with the front connecting area of staggered terminal 16c and the back connecting area of staggered terminal 16c lines up with the front connecting area of staggered terminal 16d. Finally, the back connecting area of staggered terminal 16d lines up with the front connecting area of staggered terminal 16a by means of an extended connection represented by dotted line 18. The connections associated with the "write" terminal of chip 11 are similar. This particular configuration of staggered terminals is arranged for a maximum of four layers in a stack (a mother board 20 plus three modules 10). As can be seen, the number of staggered terminals needed for a given circuit is equivalent to the number of layers in the stack. However, it is not necessary for all the possible layers in a stack to be present.

Referring now to FIG. 2, terminals 26a, 26b, 26c and 26d on mother board 20 are arranged similarly to terminals 16a, 16b, 16c and 16d on module 10 as just described, with additional leads 23 connecting such terminals to the appropriate circuits (not shown) for driving the "read" terminals of the various memory chips.

Because lead 28 for the "read" circuit for chip 21 on mother board 20 terminates on mother board 20 itself, there is no need to extend it to any of modules 10 in the stack. Thus, the connecting areas of staggered terminal 26a could be disconnected. However, if it is desired to mount all the memory chips on modules 10 and not have memory chip 21 on mother board 22, then lead 28 must be connected to the connecting areas of staggered terminal 26a as shown.

Figure 6:
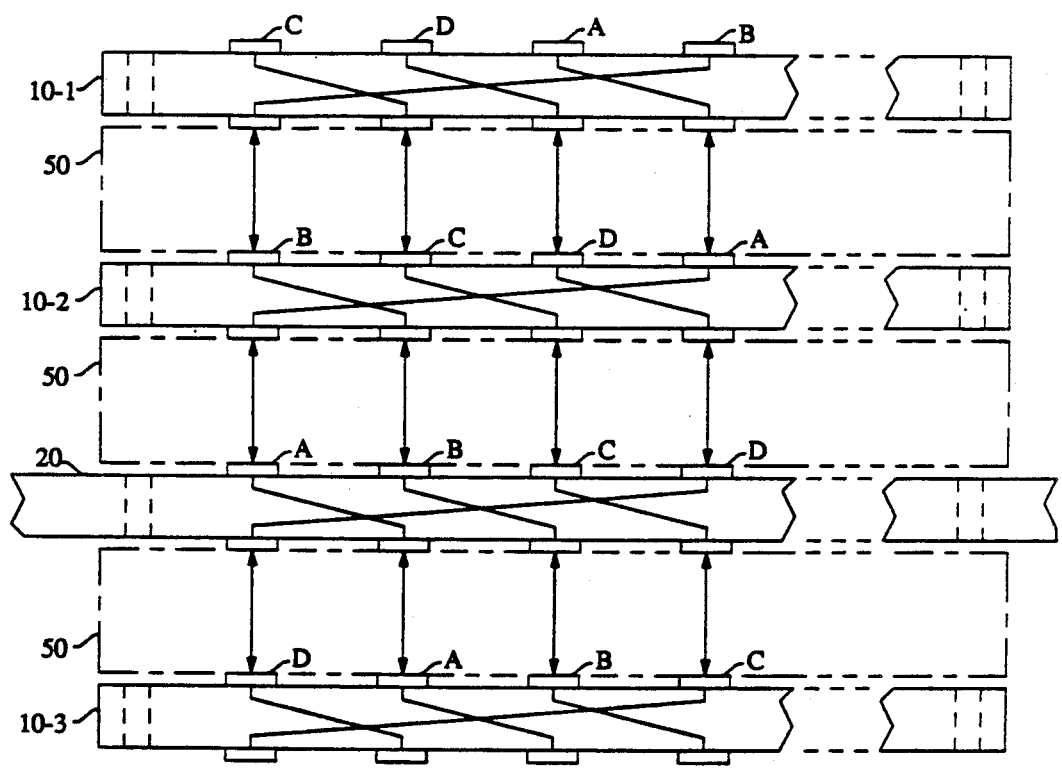
FIG. 6 is a schematic side view of the stack shown in FIG. 5 to more clearly show the paths of one set of individual circuits.

Referring now to FIG. 6, the various interconnections associated with the staggered terminals and the intervening connectors in the stack are shown diagrammatically as an aid in understanding the relationships involved. Four leads A, B, C and D are shown passing through the stack, which would connect respectively to leads 28a, 28b, 28c and 28d on mother board 20 as shown in FIG. 2. Given that such modules and mother board are arranged as shown in FIGS. 1 and 2, it can be seen that lead A connects to chip 21 on mother board 20, lead B connects to chip 11 on module 10-1, lead C connects to chip 11 on module 10-2 and lead D connects to chip 11 on module 10-3. If the stack were rearranged with module 10-3 placed on top of the stack, it can also be seen that lead D would still connect to chip 11 on such module.

In the example given above, three of the staggered terminals shift three of leads A, B, C and D one position in each layer of the stack and the fourth staggered terminal shifts the fourth lead back to the first position. Many other arrangements of staggered terminals are possible. For example, if it is desired to arrange leads in pairs, the staggered terminals can be arranged to shift all but one pair of leads two positions in each layer of the stack and the remaining pair back to the first position.

It is understood that the embodiments described herein are only illustrative and that other arrangements may be devised without departing from the spirit and scope of the invention.

I claim:

1. A three-dimensional circuit structure which comprises:
    a plurality of circuit modules mounted in a stack, each circuit module being a substantially planar circuit board having conductors and a plurality of terminals thereon, each terminal having a first connecting area on one side of the circuit module connected to a second connecting area on the other side of the circuit module, at least some of the terminals being staggered terminals having the first connecting area opposite the second connecting area of a different staggered terminal, at least one of the staggered terminals on each module being connected by one of the conductors to first utilizing means mounted on the module and
    means for connecting opposing ones of the first and second connecting areas on adjacent circuit modules in the stack when said connecting means is placed between said adjacent modules.

2. The circuit structure of claim 1 in which at least one of the terminals on each circuit module is a through terminal having its first connecting area opposite the second connecting area of the same through terminal and at least one of the through terminals on each module is connected by one of the conductors to the first utilizing means mounted on the module.

3. The circuit structure of claim 1 or claim 2 in which at least one of the circuit modules has means for connecting at least one of the staggered terminals and/or the through terminals to second utilizing means.

4. The circuit structure in accordance with claim 3 in which each of the first utilizing means comprises a semiconductor memory and the second utilizing means comprises means for reading, writing and powering the semiconductor memories.

5. A circuit module for use in a stack of similar modules in conjunction with connecting means placed between the modules in said stack, which comprises
    a substantially planar circuit board having conductors and a plurality of terminals thereon, each terminal having a first connecting area on one side of the circuit module connected to a second connecting area on the other side of the circuit module, at least one set of the terminals being staggered terminals, each staggered terminal having its first connecting area opposite the second connecting area of a different staggered terminal, at least one of the staggered terminals on each module being connected by one of the conductors to first utilizing means mounted on the module, whereby the first connecting areas on one of the circuit modules will be connected to opposing second connecting areas on an adjacent circuit module when assembled with the connecting means in the stack.

6. The circuit module of claim 5 in which at least one of the terminals is a through terminal having its first connecting area opposite the second connecting area of the same through terminal and at least one of the through terminals is connected by one of the conductors to the first utilizing means mounted on the module.

7. The circuit module of claim 6 in which the first utilizing means comprises a semiconductor memory.

8. The circuit module of claim 6 which also comprises means for connecting at least one of the staggered terminals and/or through terminals to second utilizing means.

9. The circuit module of claim 8 in which the first utilizing means comprises a semiconductor memory and the second utilizing means comprises means for reading, writing and powering semiconductor memories.

* * * * *